United States Patent
Kim et al.

(10) Patent No.: US 11,189,794 B2
(45) Date of Patent: Nov. 30, 2021

(54) PEROVSKITE MULTILAYERED STRUCTURE AND MANUFACTURING METHOD THEREOF

(71) Applicant: KOREA INSTITUTE OF SCIENCE AND TECHNOLOGY, Seoul (KR)

(72) Inventors: In Soo Kim, Seoul (KR); Young Hwan Kim, Seoul (KR); Kwan Il Lee, Seoul (KR); Chun Keun Kim, Seoul (KR); Byung Hyun Nam, Seoul (KR); Hye Jun Kim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 16/883,597

(22) Filed: May 26, 2020

(65) Prior Publication Data

US 2021/0091309 A1  Mar. 25, 2021

(30) Foreign Application Priority Data

Sep. 19, 2019 (KR) .................. KR10-2019-0115580

(51) Int. Cl.
*H01L 51/00* (2006.01)
*H01L 51/42* (2006.01)

(52) U.S. Cl.
CPC ...... *H01L 51/0003* (2013.01); *H01L 51/0008* (2013.01); *H01L 51/4253* (2013.01); *H01L 51/4293* (2013.01)

(58) Field of Classification Search
CPC ............. H01L 51/0003; H01L 51/0008; Y10S 977/812
See application file for complete search history.

(56) References Cited

U.S. PATENT DOCUMENTS 10,700,229 B2 * 6/2020 Zhu ..................... H01L 31/0256

FOREIGN PATENT DOCUMENTS

| KR | 10-2019-0015642 A | 2/2019 |
| KR | 10-1998021 B1 | 7/2019 |
| WO | WO 2016/094966 A1 | 6/2016 |

* cited by examiner

*Primary Examiner* — Anthony Ho
(74) *Attorney, Agent, or Firm* — Birch, Stewart, Kolasch & Birch, LLP

(57) ABSTRACT

A method of manufacturing a perovskite multilayered structure includes providing a substrate, forming a first perovskite layer on the substrate, forming a second perovskite layer by a reaction between the halogen compounds and at least one of the metal halides, the metal oxides, or the metal sulfides.

9 Claims, 10 Drawing Sheets

TOP GRAPH: XRD GRAPH FOR PE (MAPbBr$_3$ + MAPbI$_3$) HAVING MULTILAYER STRUCTURE
MIDDLE GRAPH: XRD GRAPH FOR SINGLE LAYER (MAPbBr$_3$)
LOWER GRAPH: XRD GRAPH FOR SINGLE LAYER (MAPbI$_3$)

TOP GRAPH: XRD GRAPH FOR PE ($MAPbBr_3$ + $MAPbI_3$) HAVING MULTILAYER STRUCTURE
MIDDLE GRAPH: XRD GRAPH FOR SINGLE LAYER ($MAPbBr_3$)
LOWER GRAPH: XRD GRAPH FOR SINGLE LAYER ($MAPbI_3$)

PEROVSKITE MULTILAYERED STRUCTURE AND MANUFACTURING METHOD THEREOF

CROSS-REFERENCE TO RELATED APPLICATIONS

This application claims priority from Korean Patent Application No. 10-2019-0115580, filed on Sep. 19, 2019, in the Korean Intellectual Property Office, the disclosure of which is incorporated herein by reference in its entirety.

BACKGROUND

Technical Field

The present disclosure relates to a perovskite multilayered structure and a manufacturing method thereof, and more particularly, to a perovskite multilayered structure having a graded-bandgap and a manufacturing method thereof.

Description of the Related Art

Perovskites refers to materials or compounds having a perovskite crystal structure such as the crystal structure of $ABX_3$, for example. Inorganic metal oxide perovskites have inorganic metal oxides. For example, as demonstrated in $SrFeO_3$, $LaMnO_3$, $CaFeO_3$, metal cations such as Ti, Sr, Ca, Cs, Ba, Y, Gd, La, Fe, and Mn (e.g., alkali metal, alkaline earth metal, transition metal and lanthanum group, etc.) having different sizes may be positioned at A site and B site, while oxygen anions may be positioned at X site. Halide perovskites are different in composition from inorganic metal oxide perovskites in that organic compounds are positioned at the A site and halogen anions are positioned at the X site.

As the crystal structure is filled with various elements, the physical properties of perovskites may vary. Inorganic metal oxide perovskites exhibit characteristics such as superconductivity, ferroelectricity, high magnetoresistance, which can be used for sensors, fuel cells, memory devices, and the like.

Meanwhile, halide perovskites can be obtained using inexpensive raw materials and solution processes. Also, halide perovskites are highly compatible with existing semiconductor processes while having excellent optical and electrical characteristics. Thus, halide perovskites are spotlighted as the next generation materials for optoelectronic devices (e.g., solar cells, light emitting diodes, photodetectors, etc.). In the field of solar cells, there are increasing expectations that halide perovskite-based solar cells will replace silicon-based solar cells or be used in tandem with silicon-based solar cells.

Since perovskites generally have a single layer structure, there is a considerable limit on the modification or improvement of the physical properties of perovskites. For example, a solvent such as dimethylformamide (DMF) or dimethyl sulfoxide (DMSO) used in spin coating process may dissolve perovskites. When forming a second perovskite layer on a first perovskite layer, DMF or DMSO to be used for forming the second perovskite may dissolve the first perovskite layer. Accordingly, only single-layered perovskites can be formed through the spin coating process, and it is impossible to form multilayered perovskites in a simple and cost-effective manner.

SUMMARY

The present disclosure has been made to overcome the problems mentioned above, and it is an object of the present disclosure to provide a perovskite multilayered structure and a manufacturing method thereof.

Another object of the present disclosure is to manufacture a perovskite multilayered structure using vapor deposition.

Yet another object of the present disclosure is to manufacture a perovskite multilayered structure having a graded bandgap by use of vapor deposition.

According to an embodiment of the present disclosure, a perovskite multilayered structure can be manufactured using vapor deposition.

According to an embodiment of the present disclosure, a perovskite multilayered structure with a graded bandgap may be formed using vapor deposition.

It is possible to provide an optoelectronic device that absorbs light of a wide range of wavelengths, using the perovskite multilayered structure in accordance with an embodiment of the present disclosure.

It is possible to provide an optoelectronic device that emits light of various colors, using the perovskite multilayered structure in accordance with an embodiment of the present disclosure.

The effects of the present disclosure are not limited to those mentioned above, and other objects that are not mentioned above can be clearly understood to those skilled in the art from the claims.

In some embodiment, the presently disclosed subject matter provides a method of manufacturing a perovskite multilayered structure, comprising: providing a substrate; forming a first perovskite layer on the substrate; forming a metal layer on the first perovskite layer by exposing the substrate to at least one of metal halides, metal oxides, or metal sulfides in a vapor phase; and supplying halogen compounds onto the metal layer to form a second perovskite layer by a reaction between the halogen compounds and at least one of the metal halides, the metal oxides, or the metal sulfides included in the metal layer.

In some embodiment, the halogen compounds are supplied onto the metal layer in a solution phase.

In some embodiment, the halogen compounds are supplied onto the metal layer in a vapor phase.

In some embodiment, the presently disclosed subject matter provides a method of manufacturing a perovskite multilayered structure, comprising: providing a substrate; forming a first perovskite layer on the substrate; supplying halogen compounds in a vapor phase and at least one of metal halides, metal oxides, or metal sulfides in a vapor phase onto the first perovskite layer; and forming a second perovskite layer by a reaction between the halogen compounds and at least one of the metal halides, the metal oxides, or the metal sulfides.

In some embodiment, the second perovskite layer is formed through a dual source vapor deposition process.

In some embodiment, the composition of the first perovskite layer and the composition of the second perovskite layer are different from each other.

In some embodiment, the perovskite multilayered structure has a graded bandgap.

In some embodiment, the presently disclosed subject matter provides perovskite multilayered structure, comprising: a first perovskite layer; and a second perovskite layer formed on the first perovskite layer.

In some embodiment, the second perovskite layer is formed by a reaction between a metal layer and halogen compounds.

In some embodiment, the metal layer is formed by depositing at least one of metal halides, metal oxides, or metal sulfides in a vapor phase on the first perovskite layer.

In some embodiment, the presently disclosed subject matter provides a perovskite multilayered structure, comprising: a first perovskite layer; and a second perovskite layer formed on the first perovskite layer.

In some embodiment, the second perovskite layer is formed by a reaction between halogen compounds in a vapor phase and at least one of metal halides, metal oxides, or metal sulfides in a vapor phase.

In some embodiment, the composition of the first perovskite layer and the composition of the second perovskite layer are different from each other.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

Figure 1:
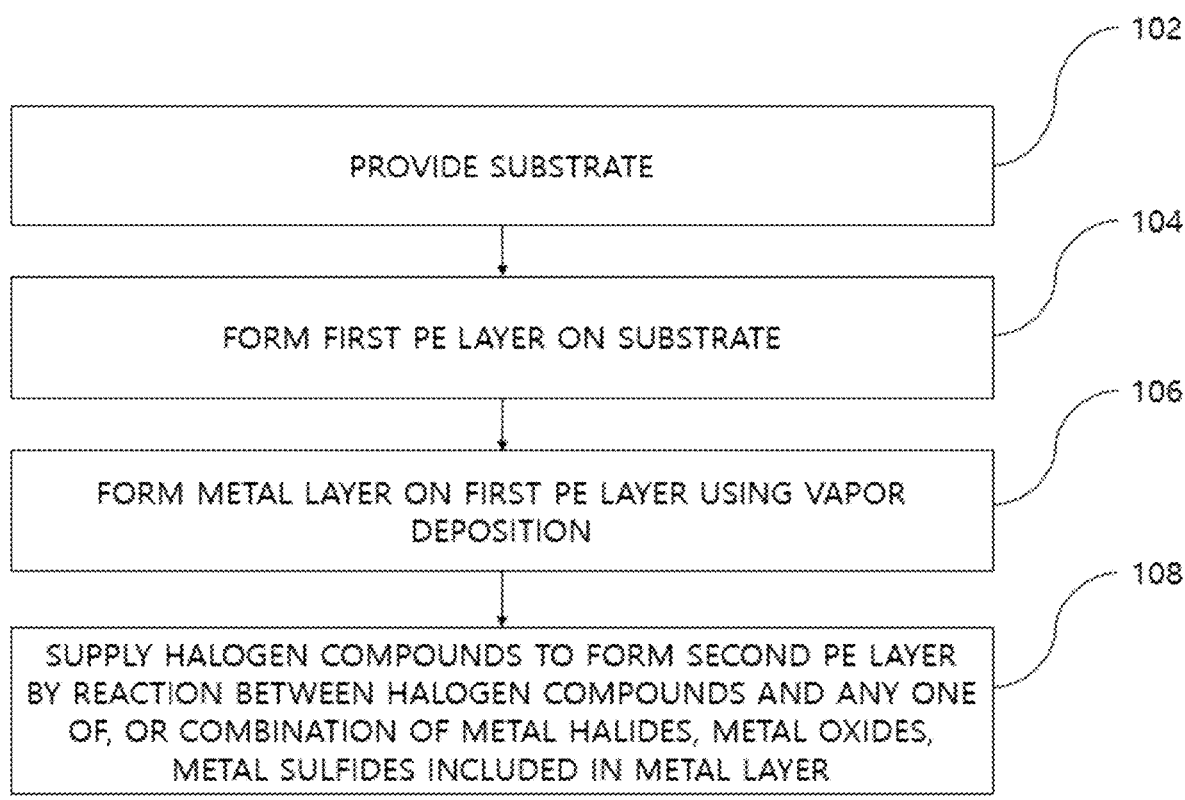
FIG. 1 is a flowchart showing a method of manufacturing a perovskite multilayered structure according to an embodiment of the present disclosure.

As used throughout the description, the term "perovskite" or "PE" refers to materials or compounds having a perovskite crystal structure, which may have various perovskite crystal structures in addition to the crystal structure of $ABX_3$.

As used throughout the description, the term "optoelectronic device" is used to refer to a device, which can convert light into energy and vice versa. For example, the optoelectronic device may include light emitting diode (LED), solar cell, photodetector, X-ray detector, or laser.

As used throughout the description, the term "halides" or "halogen compounds" refers to materials or compounds containing halogen belonging to group 17 of the periodic table in the form of functional groups, and may include chlorine, bromine, fluorine or iodine compounds, for example. In addition, "halides" or "halogen compounds" may be in a solution phase dissolved in a solvent or in a vapor or plasma phase.

As used throughout the description, the term "layer" refers to a form of a layer having with a thickness. The layer may be porous or non-porous. By "(being) porous," it means having a porosity. The layer may have a bulk form or may be a single crystal thin film.

Throughout the description, when it is described that a certain member is positioned "on" another member, unless specifically stated otherwise, it includes not only when the certain member is in contact with another member, but also when the two members are intervened with yet another member that may be present therebetween.

As used throughout the description, the term "vapor" phase refers to the vapor phase as well as the plasma phase.

As used throughout the description, the terms "about," "substantially" are meant to encompass tolerances.

As used throughout the description, the expression "A and/or B" refers to "A, or B, or A and B."

Throughout the description, when a portion is stated as being "connected" to another portion, it encompasses not only when the portions are "directly connected," but also when the portions are "electrically connected" while being intervened by another element present therebetween.

Hereinafter, preferred embodiments of the present disclosure will be described in detail with reference to the accompanying drawings so that those with ordinary knowledge in the art can easily achieve the present disclosure. However, the description proposed herein is just an embodiment for the purpose of illustrations only, not intended to limit the scope of the disclosure, so it should be understood that other equivalents and modifications could be made thereto without departing from the scope of the disclosure. In the following description, the functions or elements irrelevant to the present disclosure will not be described for the sake of clarity, and the like reference numerals are used to denote the same or similar elements in the description and drawings.

FIG. 1 is a flowchart showing a method of manufacturing a PE multilayered structure according to an embodiment of the present disclosure.

At 102, a substrate is provided. One or more of substrates may be provided. For example, the substrate may be one of a glass substrate, a thin film glass substrate, or a plastic substrate in consideration of the desired properties (e.g., transparency, surface smoothness, water resistance, etc.). A substrate may be modified to meet the purpose of the PE multilayered structure formed on the substrate.

The substrate may be single-layered or multilayered.

According to an embodiment of the present disclosure, a first electrode may be formed on the substrate. The first electrode may be an anode or a cathode. For example, the first electrode may be a conductive oxide such as indium-tin oxide (ITO) or indium-zinc oxide (IZO), fluorine-doped tin oxide (FTO). Alternatively, the first electrode may include a material selected from the group consisting of silver (Ag), gold (Au), magnesium (Mg), aluminum (Al), platinum (Pt), tungsten (W), copper (Cu), molybdenum (Mo), nickel (Ni), palladium (Pd), chromium (Cr), calcium (Ca), samarium (Sm), lithium (Li), and combinations thereof. Alternatively, the first electrode may form on a flexible and transparent material.

According to an embodiment of the present disclosure, an electron transporting layer (ETL) or a hole transporting layer (HTL) may be formed on the first electrode.

The electron transporting layer may be a semiconductor including an "n-type material." The "n-type material" means an electron-transporting material. The electron-transporting material may be at least one of electron-transporting elements or compounds. The electron-transporting electrons or compounds may be undoped or doped with one or more dopant elements.

The hole transporting layer may be a semiconductor including a "p-type material." The "p-type material" means a hole-transporting material. The hole-transporting material may be at least one of hole-transporting elements or compounds. The hole-transporting elements or compounds may be undoped or doped with one or more dopant elements.

The electron transporting layer or the hole transporting layer may be a buffer layer or may include a buffer layer. The surface of the electron transporting layer or hole transporting layer may be modified using doping. The electron transporting layer or the hole transporting layer may be formed by spin coating, dip coating, inkjet printing, gravure printing, spray coating, bar coating, gravure coating, brush painting, thermal evaporation, sputtering, E-Beam, screen printing, or blade process. The electron transporting layer or the hole transporting layer may be coated in a film form or be deposited on the surface of the electrode.

At S104, a first PE layer is formed on the substrate. The first PE layer may be formed in direct contact with the substrate. Alternatively, the first PE layer may be formed in direct contact with the first electrode. Alternatively, the first PE layer may be formed in direct contact with the electron transporting layer or the hole transporting layer.

The first PE layer may be formed through various processes including vapor deposition process and solution process.

According to an embodiment of the present disclosure, the first PE layer may be formed using a vapor deposition process. The vapor deposition process may include depositing materials onto the surface of a target object (e.g., a substrate) by supplying the materials in a vaporized or plasma phase into a vacuum chamber. For example, metal halides (e.g., $PbI_2$), which are converted into a vapor phase by heat, may be deposited on the substrate in a vacuum state, and then the substrate may be immersed in an organic halide solution (e.g., methylammonium iodide (MAI) solution) to form the first PE layer. Alternatively, the first PE layer may be formed by depositing the metal halides, which are converted into a vapor phase by heat, on the substrate in a vacuum state, and then applying the organic halide solution onto the substrate that is rotating. Alternatively, the first PE layer may be formed by depositing the metal halides, which are converted into a vapor phase by heat, on the substrate in a vacuum state, and then exposing the substrate to the organic halide solution vapor.

According to an embodiment of the present disclosure, the first PE layer may be formed through coating process using solution. The coating process may be selected from the group consisting of spin coating, bar coating, nozzle printing, spray coating, slot die coating, gravure printing, inkjet printing, screen printing, electrohydrodynamic jet printing, electrospray, and combinations thereof.

According to an exemplary spin coating process, adduct complexes are prepared. The adduct complexes include a first compound and a second compound which are dissolved in a first solvent. The adduct complexes dissolved in the first solvent are applied onto the substrate. A second solvent is added and coated on the substrate. An anti-solvent is applied on the substrate and the substrate is vacuum-annealed. For example, the first compound may be organic halides (e.g., $CH_3NH_3Br$), the second compound may be metal halides (e.g. $PbBr_2$), the first solvent may be dimethylformamide (DMF) or dimethylsulfoxide (DMSO), the second solvent may be diethylether or toluene, and the anti-solvent may be chloroform. In an example, the anti-solvent means a solvent which does not dissolve perovskite. An exemplary anti-solvent may include a non-polar organic solvent.

At S106, a metal layer is formed on the first PE layer using vapor deposition.

The metal layer may include at least one of metal halides, metal oxides, or metal sulfides. The metal halides may have the formula $BX_2$, where B may be a metal cation selected from the group consisting of Pb, Sn, Cu, Ni, Co, Fe, Mn, Cr, Pd, Cd, Yb, Ge, Ca, Sr, Eu and combinations thereof, and X may be a halide anion. For example, the metal halides may be $PbI_2$ or $PbBr_2$, although not limited thereto. In addition, the metal halides may include a chalcogenide anion in place of, or in addition to at least some of the halide anions.

The metal oxides may have the formula BO, where B may include a metal cation selected from the group consisting of Pb, Sn, Cu, Ni, Co, Fe, Mn, Cr, Pd, Cd, Yb, Ge, Ca, Sr, Eu and combinations thereof. For example, the metal oxide may be PbO or SnO.

The metal sulfides may have the formula BS, where B may include a metal cation selected from the group consisting of Pb, Sn, Cu, Ni, Co, Fe, Mn, Cr, Pd, Cd, Yb, Ge, Ca, Sr, Eu and combinations thereof. For example, the metal sulfide may be PbS or SnS.

According to an embodiment of the present disclosure, metal halides, metal oxides, or metal sulfides, which are converted into a vapor phase by heat, may be deposited on the substrate in a vacuum to form a metal layer (that is, metal halide layer, metal oxide layer, or metal sulfide layer). Since the metal halide layer, the metal oxide layer, or the metal sulfide layer is formed through vapor deposition without solvent on the first PE layer, the problem can be solved that the first PE layer is dissolved by the solvent during the formation of a second PE layer.

According to an embodiment of the present disclosure, a combination of any one or more of metal halides, metal oxides, and metal sulfides, which are converted into a vapor phase by heat, may be deposited on the substrate in a vacuum to form a metal layer. Since the metal layer is formed on the first PE layer through the vapor deposition without solvent, the problem can be solved that the first PE layer is dissolved by the solvent during the formation of a second PE layer.

At S108, halogen compounds are supplied to the substrate to form a second PE layer using a reaction between the halogen compounds and at least one of metal halides, metal oxides, or metal sulfides included in the metal layer and.

The halogen compounds may be provided on the metal layer in a solution or vapor phase. The halogen compounds may have the formula AX, where A may be an organic cation or an alkali metal cation, and X may include a halide anion. In addition, the halogen compounds may include a chalcogenide anion in place of, or in addition to at least some of the halide anions.

The organic cation includes a carbon. The organic cation may further include other elements, and for example, may further include hydrogen, nitrogen or oxygen.

According to an embodiment of the present disclosure, the reaction between the metal layer and the halogen compounds may occur by the immersion process, the spin coating process, or the vapor deposition process. The reaction may also occur in the processes other than those described herein. For example, the second PE layer may be formed by immersing the substrate with the metal layer in a solution containing the halogen compounds, causing a reaction between the halogen compounds and any least one of the metal halides, the metal oxides, or the metal sulfides included in the metal layer. Alternatively, the second PE layer may be formed by applying a solvent containing halogen compounds onto a substrate that includes the metal layer. The substrate with the metal layer may rotate and be spin-coated, causing a reaction between the halogen compounds and at least one of the metal halides, the metal oxides, or the metal sulfides included in the metal layer.

Alternatively, the second PE layer may be formed by exposing the substrate including the metal layer to the halogen compound vapor, causing a reaction between the halogen compounds and at least one of the metal halides, the metal oxides, or the metal sulfides included in the metal layer.

Additionally, an electron transporting layer or a hole transporting layer may be formed on the second PE layer. After the electron transporting layer or the hole transporting layer is formed, a second electrode may be formed. The second electrode may be an anode or a cathode. The method of forming the electron transporting layer, the hole transporting layer, or the electrode is the same as that described above.

For example, if the PE multilayered structure is used for a solar cell having n-i-p structure, the solar cell may have a structure in which the first electrode, the electron transporting layer, the first PE layer, the second PE layer, the hole transporting layer, and the second electrode are sequentially stacked. Alternatively, if the PE multilayered structure is used for a solar cell having p-i-n structure, the solar cell may have a structure in which the first electrode, the hole transporting layer, the first PE layer, the second PE layer, the electron transporting layer, and the second electrode are sequentially stacked.

Figure 2:
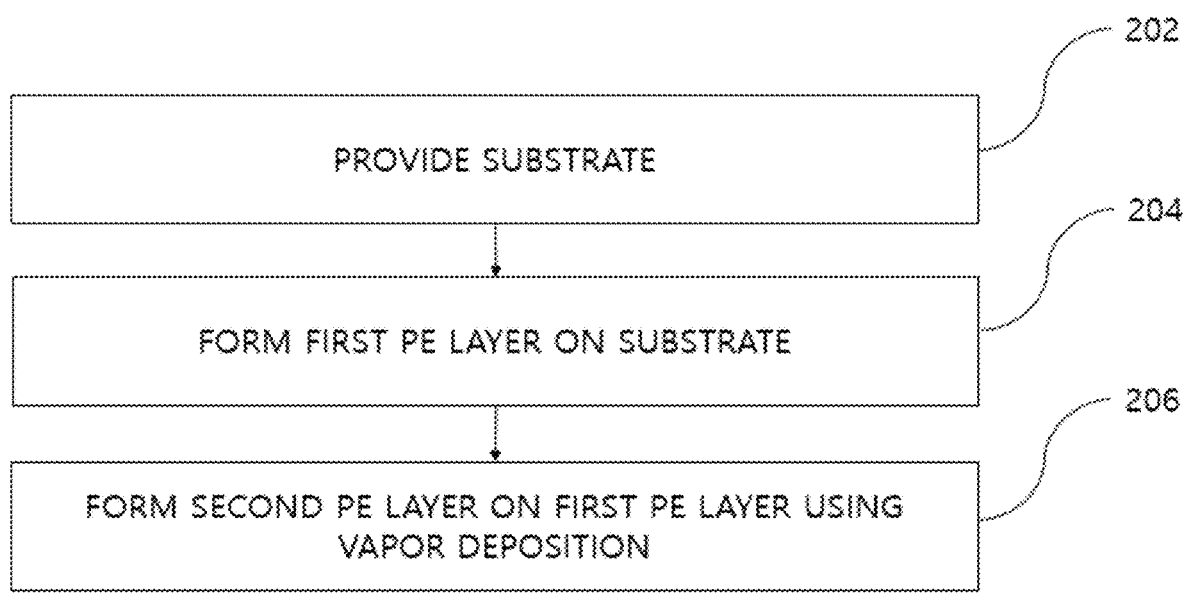
FIG. 2 is a flowchart showing a method of manufacturing a perovskite multilayered structure according to another embodiment of the present disclosure.

FIG. 2 is a flowchart showing a method of manufacturing a PE multilayered structure according to another embodiment of the present disclosure.

At S202, the substrate is provided, and at S204, the first PE layer is formed. Since the operations at S102 and S104 may be applied to the operations at S202 and S204, respectively, detailed descriptions of S202 and S204 will be omitted.

At S206, the second PE layer is formed on the first PE layer using vapor deposition. The thickness of the second PE layer may be controlled through the vapor deposition. For example, the vapor deposition process may continue until the second PE layer reaches a thickness of 10 nm to 100 μm.

The process of forming the second PE layer by the vapor deposition may be accomplished by evaporating reactants to produce vapor and exposing the first PE layer to the vapor to form the second PE layer on the first PE layer. Since the second PE layer is formed through the vapor deposition without solvent, the problem can be solved that the first PE layer is dissolved by the solvent during the formation of the second PE layer.

According to an embodiment of the present disclosure, the vapor deposition may be dual source vapor deposition. According to the dual source vapor deposition process, the vapor exposed on the first PE layer includes compounds produced from two separate sources. Alternatively, the dual source vapor deposition equipment may be modified to use three or more sources.

The reactants may include a first source reactant and a second source reactant. The first source reactant may include at least one of the metal halides, the metal oxides, or the metal sulfides.

The metal halides may have the formula $BX_2$, where B may include a metal cation selected from the group consisting of Pb, Sn, Cu, Ni, Co, Fe, Mn, Cr, Pd, Cd, Yb, Ge, Ca, Sr, Eu and combinations thereof, and X may include a halide anion. For example, the metal halides may be $PbI_2$ or $PbBr_2$. In addition, the metal halides may include a chalcogenide anion in place of, or in addition to at least some of the halide anions.

The metal oxides may have the formula BO, where B may include a metal cation selected from the group consisting of Pb, Sn, Cu, Ni, Co, Fe, Mn, Cr, Pd, Cd, Yb, Ge, Ca, Sr, Eu and combinations thereof. For example, the metal oxides may be PbO or SnO.

The metal sulfides may have the formula BS, where B may include a metal cation selected from the group consisting of Pb, Sn, Cu, Ni, Co, Fe, Mn, Cr, Pd, Cd, Yb, Ge, Ca, Sr, Eu and combinations thereof. For example, the metal sulfides may be PbS or SnS.

The second source reactant may include halogen compounds. The halogen compounds may have the formula AX, where A may be an organic cation or an alkali metal cation, and X may be a halide anion. In addition, the halogen compounds may include a chalcogenide anion in place of, or in addition to at least some of the halide anions.

The organic cation includes a carbon. The organic cation may further include other elements, for example, may further include hydrogen, nitrogen or oxygen.

For example, the halogen compounds may be organic halides. The organic cation of the organic halides may include at least one of methylammonium (MA) or formamidinium (FA). For example, the organic halides may be methylammonium chloride, methylammonium bromide, methylammonium iodide, formamidinium chloride, formamidinium bromide, or formamidinium iodide.

For example, the organic cation may have the formula $(R1R2R3R4N)^+$. In this case, R1 to R4 may correspond to hydrogen, unsubstituted or substituted C1 to C20 alkyl, or unsubstituted or substituted aryl.

For example, the organic cation may have the formula $(R5NH_3)^+$, where R5 may correspond to hydrogen or substituted or unsubstituted C1 to C20 alkyl.

For example, the organic cation has the formula $(R6R7N=CH-NR8R9)^+$, where R6 to R9 may correspond to hydrogen, methyl, or ethyl.

According to the present disclosure, by forming the metal layer or the second PE layer on the first PE layer through vapor deposition, the problem can be solved that the first PE layer may be dissolved after forming the first PE layer. For example, when the second PE layer is formed on the first PE layer using spin coating process, the first PE layer may be dissolved by a solvent using DMF (N, N-Dimethylformamide), DMSO (Dimethysulfoxide). In the embodiment of the present disclosure, the first PE layer may be prevented from being dissolved by use of the metal layer or by use of the vapor deposition without any solvent.

Furthermore, when the first PE layer and the second PE layer have different compositions from each other, the PE multilayered structure may have a graded bandgap, which will further improve the conversion efficiency of the optoelectronic device that includes the PE multilayered structure. For example, the graded bandgap may be implemented by varying the halogen compounds included in the first PE layer and the halogen compounds included in the second PE layer as shown in the table below. The graded bandgap means that the bandgap of the first PE layer and the bandgap of the second PE layer continuously changes rather than being discrete from each other.

TABLE 1

| Halogen compounds contained in first PE layer | Halogen compounds contained in second PE layer |
| --- | --- |
| Fluoride | Chloride |
| Chloride | Fluoride |
| Chloride | Bromide |

TABLE 1-continued

| Halogen compounds contained in first PE layer | Halogen compounds contained in second PE layer |
|---|---|
| Fluoride | Bromide |
| Bromide | Fluoride |
| Fluoride | Iodide |
| Bromide | Chloride |
| Chloride | Iodide |
| Iodide | Fluoride |
| Iodide | Bromide |
| Bromide | Iodide |
| Iodide | Chloride |

Figure 3:
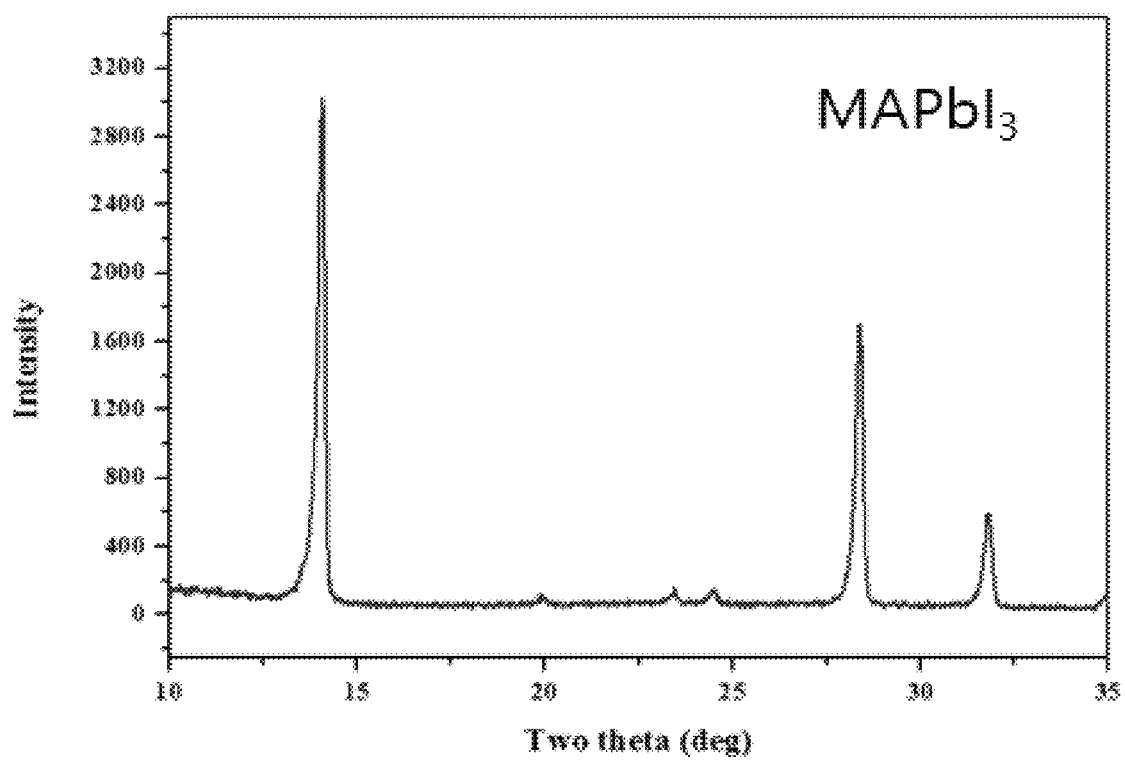
FIGS. 3 and 4 are XRD graph and SEM image of a PE single layer ($MAPbI_3$ thin film) manufactured according to an embodiment of the present disclosure.
Figure 4:
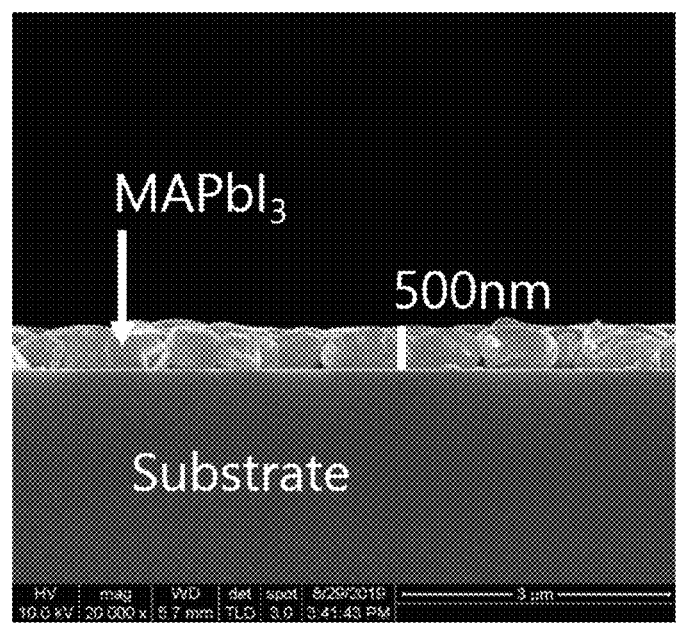

FIGS. 3 and 4 are XRD graph and SEM image of a PE single layer (MAPbI$_3$ thin film) formed by the sputtering process according to an embodiment of the present disclosure. The PE single layer formed using the sputtering process may be the first PE layer or the second PE layer in the PE multilayered structure.

After placing the PbI$_2$ sample on the cathode electrode side and placing the substrate on the anode electrode side, a PbI$_2$ thin film is deposited on the substrate using sputtering process. Thereafter, the MAPbI$_3$ thin film is formed by exposing the PbI$_2$ thin film to the methylammonium iodide (MAI) in a vapor phase. X-rays are diffracted with respect to the formed MAPbI$_3$ thin film in X-ray diffraction (XRD) equipment. An XRD graph is obtained by measuring the intensity of the diffracted X-rays with respect to the MAPbI$_3$ thin film, which corresponds to FIG. 3. The Scanning Electron Microscope (SEM) image captured from the cross section of the MAPbI$_3$ thin film corresponds to FIG. 4. As shown in FIG. 4, the cross-sectional thickness of the MAPbI$_3$ thin film was about 500 nm.

Figure 5:
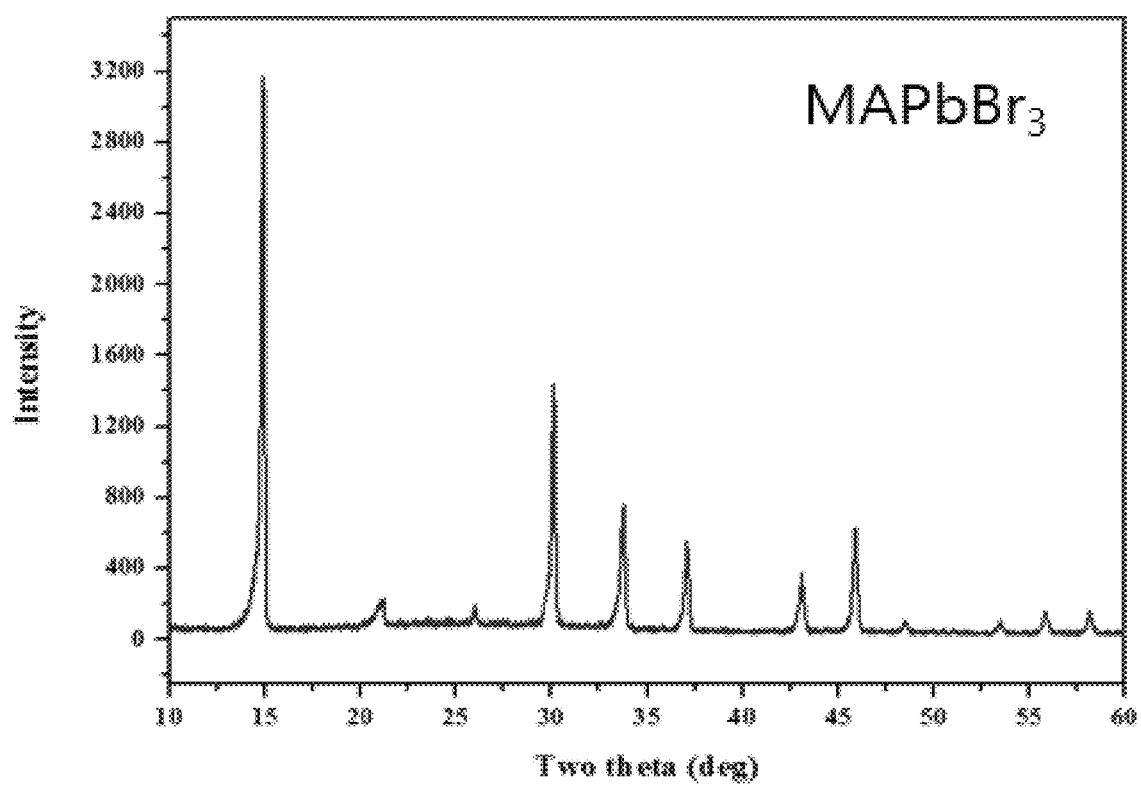
FIGS. 5 and 6 are XRD graph and SEM image of a PE single layer ($MAPbBr_3$ thin film) manufactured according to another embodiment of the present disclosure.
Figure 6:
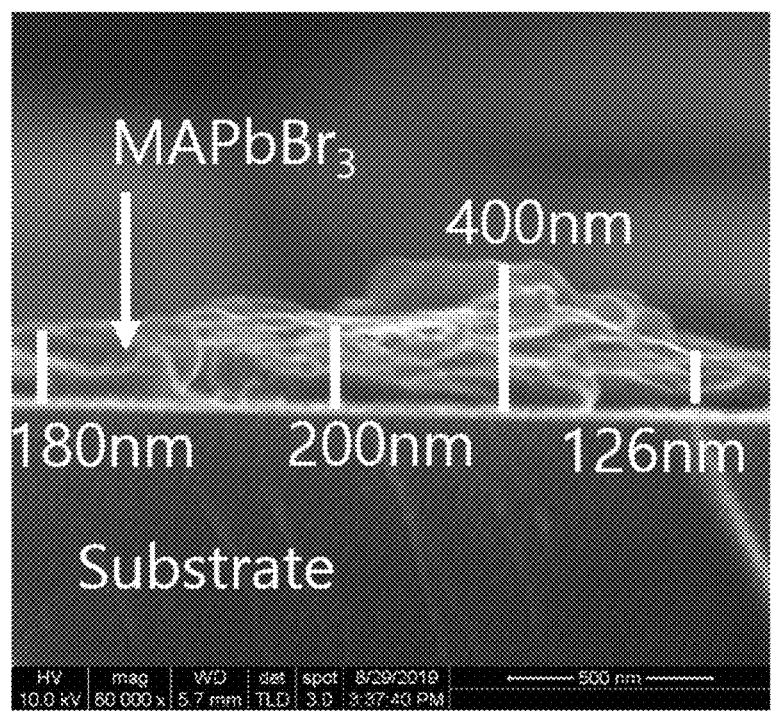

FIGS. 5 and 6 are XRD graph and SEM image of the PE single layer (MAPbBr$_3$) formed by the spin coating process according to another embodiment of the present disclosure. The PE single layer formed using the spin coating process may be the first PE layer in the PE multilayered structure.

According to the spin coating process, adduct complexes are prepared. The adduct complexes include a first compound and a second compound which are dissolved in a first solvent. The adduct complexes dissolved in the first solvent are applied onto the substrate. A second solvent is added and coated on the substrate. An anti-solvent is applied on the substrate and the substrate is vacuum-annealed. The first compound is CH$_3$NH$_3$Br and the second compound is PbBr$_2$. An XRD graph is obtained by measuring the intensity of the diffracted X-rays with respect to the MAPbBr$_3$ thin film, which corresponds to FIG. 5. The SEM image captured from the cross section of the MAPbBr$_3$ thin film corresponds to FIG. 6. As shown in FIG. 6, the cross-sectional thickness of the MAPbI$_3$ thin film varies depending on the positions, which is about 126 nm, about 180 nm, about 200 nm, and about 400 nm.

Figure 7:
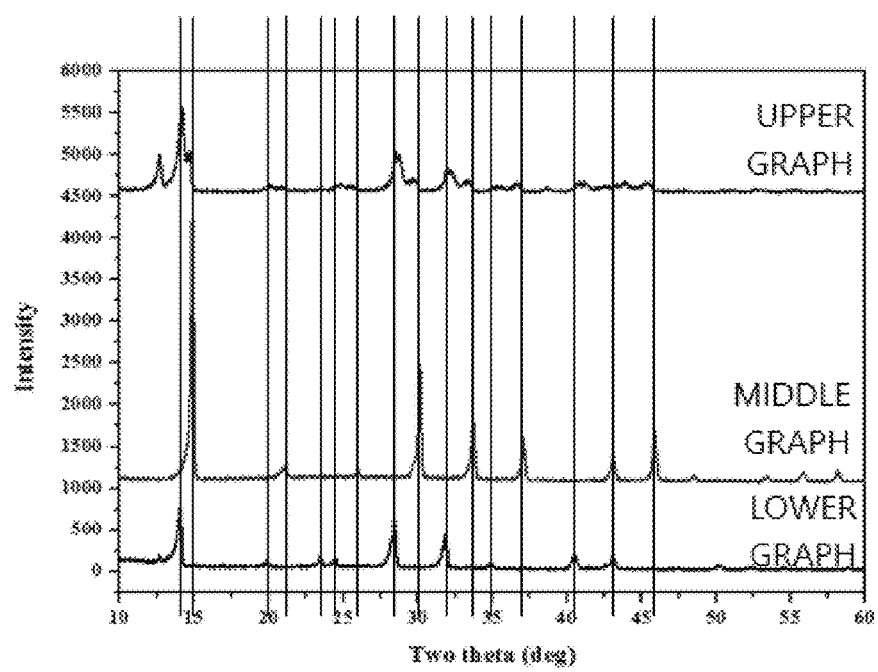
FIGS. 7 and 8 are XRD graph and SEM image of a perovskite multilayered structure including a first PE layer and a second PE layer manufactured according to an embodiment of the present disclosure.
Figure 8:
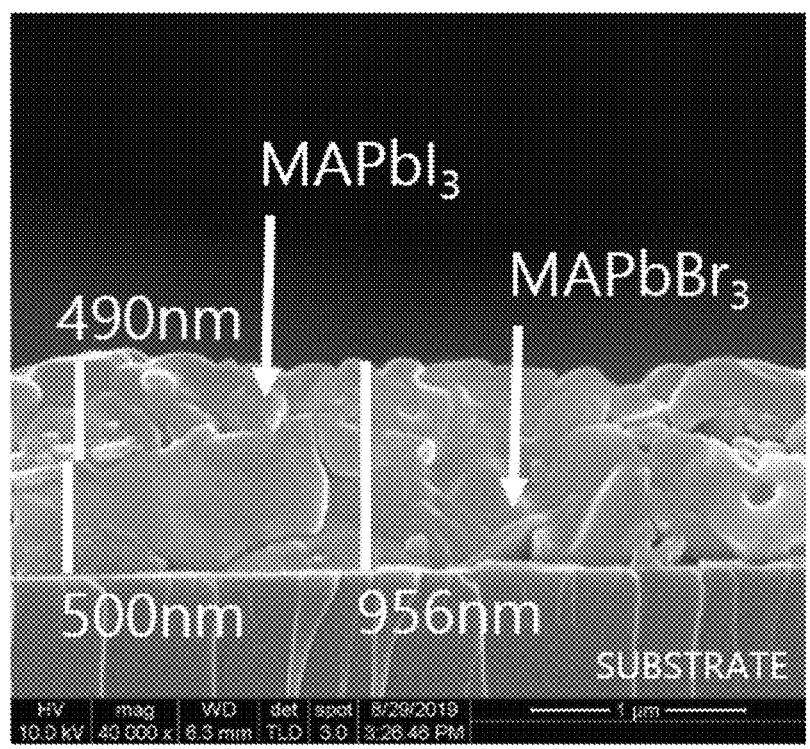

FIGS. 7 and 8 are XRD graph and SEM image of a PE multilayered structure including a first PE layer and a second PE layer manufactured according to an embodiment of the present disclosure. After forming a MAPbBr$_3$ thin film by using the spin coating process, the PbI$_2$ thin film is deposited on the MAPbBr$_3$ thin film by using the sputtering process. By exposing the PbI$_2$ thin film to MAI in a vapor phase, the PE multilayered structure is finally manufactured, in which the MAPbBr$_3$ thin film is the first PE layer or the lower layer and the MAPbI$_3$ thin film is the second PE layer or the upper layer.

According to an embodiment of the present disclosure, the flow rate of MAI vapor may be 1 to 200 standard cubic centimeters per minute (sccm, cm$^3$/min), and the exposure (reaction) time to MAI vapor may be 1 minute to 10 hours. The pressure of the chamber may be 0.1 to 760 Torr, the temperature of the substrate may be 70 to 150° C., and the temperature of the MAI vapor may be 80 to 300° C.

The result of diffracting the X-rays with respect to the PE multilayered structure corresponds to the upper graph among the three XRD graphs shown in the XRD graph of FIG. 7. The middle and lower graphs are provided for reference, which correspond to the XRD graph of MAPbBr$_3$ shown in FIG. 5 and to the XRD graph of MAPbI$_3$ shown in FIG. 3, respectively. It can be seen that the peaks of the XRD graph of MAPbBr$_3$ (i.e. the middle XRD graph) and the peaks of the XRD graph of MAPbI$_3$ (i.e., the lower XRD graph) correspond to the peaks of the XRD graph of the PE multilayered structure that includes the MAPbBr$_3$ thin film and the MAPbI$_3$ thin film (i.e., the upper XRD graph). This means that there is almost no change in the lower layer composition (MAPbBr$_3$) and the upper layer composition (MAPbI$_3$) of the PE multilayered structure in the process of manufacturing the PE multilayered structure. Also, this means that there is almost no interlayer component mixing at the interface between the upper PE layer and the lower PE layer. In this case, the PE multilayered structure may have a discrete bandgap between the PE layers. In the PE multilayered structure, although the thickness of each layer varies depending on the location, the thickness of the first PE layer is about 500 nm, the thickness of the second PE layer is about 490 nm, and the total thickness of the multilayered structure is about 956 nm (see the numerical values in FIG. 8).

Figure 9:
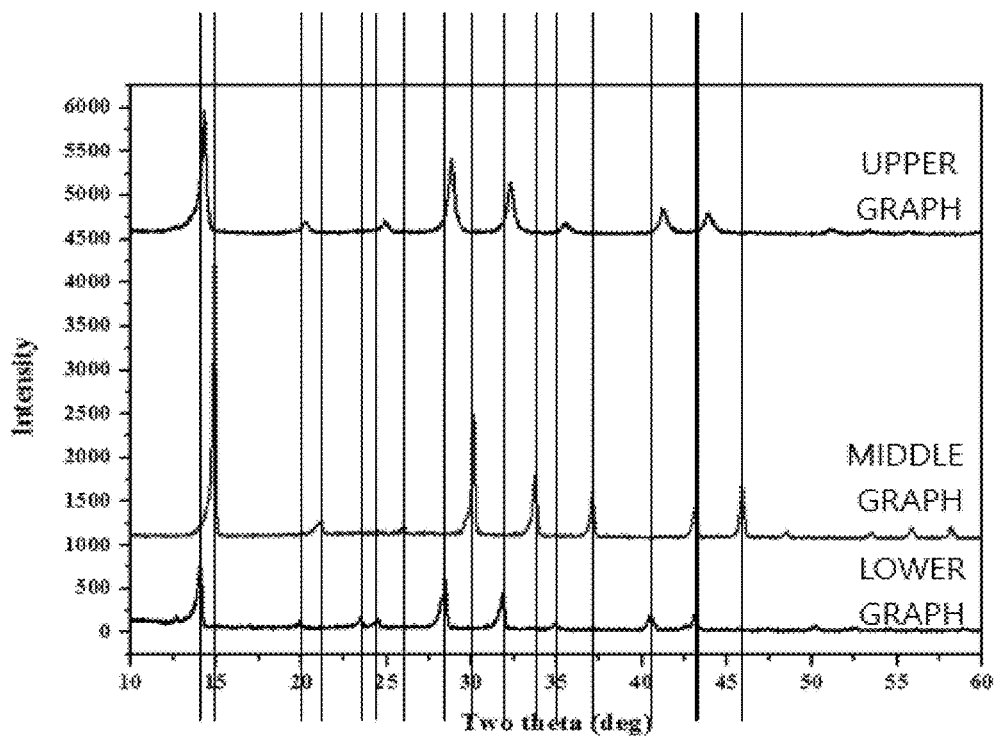
FIGS. 9 and 10 are XRD graph and SEM image of a perovskite multilayered structure including a first PE layer and a second PE layer manufactured according to another embodiment of the present disclosure.
Figure 10:
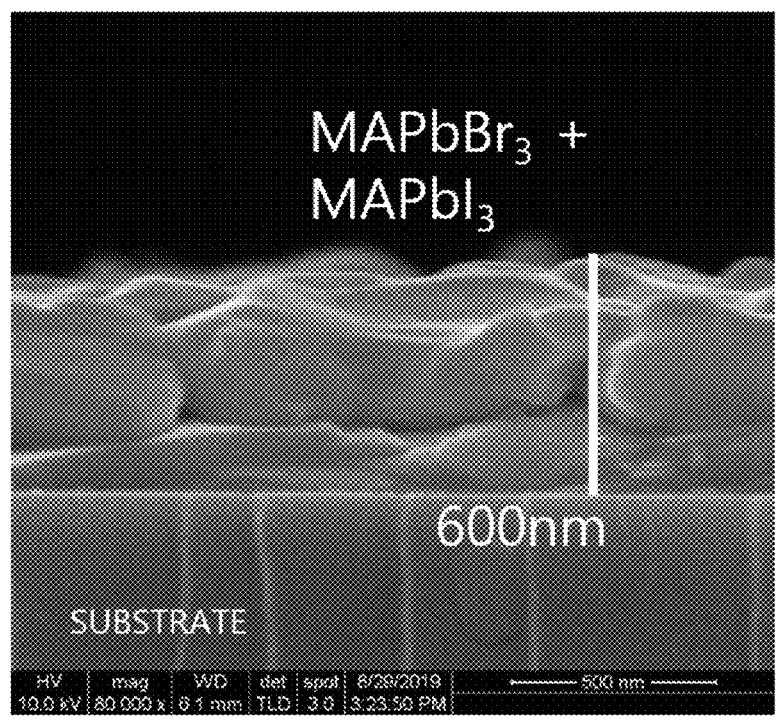

FIGS. 9 and 10 are XRD graph and SEM image of a PE multilayered structure including a first PE layer and a second PE layer manufactured according to another embodiment of the present disclosure. While the perovskite multilayered structure is prepared according to the same process as that described above with reference to FIGS. 7 and 8, after depositing the PbI$_2$ thin film on the MAPbBr$_3$ thin film using the sputtering process, the time and/or temperature of exposure or reaction to MAI vapor may vary.

The result of diffracting the X-rays with respect to the PE multilayered structure corresponds to the upper graph among the three XRD graphs shown in the XRD graph of FIG. 9. The middle and lower graphs are provided for reference, which correspond to the XRD graph of MAPbBr$_3$ shown in FIG. 5 and to the XRD graph of MAPbI$_3$ shown in FIG. 3, respectively. It may be seen that the peaks of the XRD graph of MAPbBr$_3$ (i.e. the middle XRD graph) and the peaks of the XRD graph of MAPbI$_3$ (i.e., the lower XRD graph) partially differs from the peaks of the XRD graph (i.e., the upper XRD graph) of the PE multilayered structure that includes the MAPbBr$_3$ and MAPbI$_3$ thin films. This means that there are changes in the lower layer composition (MAPbBr$_3$) and the upper layer composition (MAPbI$_3$) in the process of manufacturing the PE multilayered structure. This also means that interlayer component mixing phenomenon occurred at the interface between the upper and lower layers. In this case, the PE multilayered structure may have a graded bandgap. If necessary, the bandgap of the PE multilayered structure may be discrete or graded, which enables the PE multilayered structure to be used for various purposes.

The multilayered structure with a graded bandgap has a continuous change of the composition, and therefore, each layer is not divided clearly. The total thickness of the multilayer structure is about 600 nm (see the numerical values in FIG. 10).

The process conditions for manufacturing the PE multilayered structure with a discrete bandgap between the layers in relation to FIGS. 7 and 8, and the process conditions for manufacturing the PE multilayered structure with a graded bandgap in relation to FIGS. 9 and 10 are listed in the table below. However, the following process conditions are merely one of embodiments of the present disclosure, and the present disclosure is not limited by the following process conditions.

TABLE 2

| Condition (Unit) | Multilayer Discrete Bandgap (Related to FIGS. 7 and 8) | Graded Bandgap (Related to FIGS. 9 and 10) |
|---|---|---|
| Chamber Pressure (Torr) | 1 | 1 |
| MAI temperature (deg C.) | 180 | 180 |
| Substrate Temperature (deg C.) | 120 | 120 |
| Carrier Gas Flow Rate (sccm) | 100 | 100 |
| Reaction time (min) | 30 | 45 |

According to an embodiment of the present disclosure, the PE multilayered structure manufactured by the method described above may be incorporated into an optoelectronic device. The optoelectronic device may be a light emitting diode (LED), a solar cell, a photodetector, an X-ray detector, or a laser.

According to an embodiment of the present disclosure, the PE multilayered structure manufactured by the method described above may be incorporated into a color filter, a photo catalysis, a phototransistor, or a memrister.

According to an embodiment of the present disclosure, a plurality of layers (e.g., three or more of layers) may be formed by repeating the operations as stated above. Accordingly, a halide PE multilayered structure that has a desired number of layers may be formed. Using such halide PE multilayered structure, an optoelectronic device may absorb light of a wide wavelength range, or an optoelectronic device may emit light of various colors. Further, by use of the PE multilayered structure, it is possible to control the physical properties of PE for color filters, photo catalysts, phototransistors, or memristors.

The previous description of the disclosure is provided to enable those skilled in the art to perform or use the disclosure. Various modifications of the disclosure will be readily apparent to those skilled in the art, and the generic principles defined herein may be applied to various modifications without departing from the scope of the disclosure. Thus, the present disclosure is not intended to be limited to the examples described herein but is intended to be accorded the broadest scope consistent with the principles and novel features disclosed herein.

While the present disclosure has been described in connection with some embodiments herein, it should be understood that various modifications and changes may be made without departing from the scope of the present disclosure as would be understood by those skilled in the art. Further, such modifications and changes are intended to fall within the scope of the claims appended herein.

What is claimed is:

1. A method of manufacturing a perovskite multilayered structure, comprising:
   providing a substrate;
   forming a first perovskite layer on the substrate;
   forming a metal layer on the first perovskite layer by exposing the substrate to at least one of metal halides, metal oxides, or metal sulfides in a vapor phase; and
   supplying halogen compounds onto the metal layer to form a second perovskite layer by a reaction between the halogen compounds and at least one of the metal halides, the metal oxides, or the metal sulfides included in the metal layer.

2. The method according to claim 1, wherein the halogen compounds are supplied onto the metal layer in a solution phase.

3. The method according to claim 1, wherein the halogen compounds are supplied onto the metal layer in a vapor phase.

4. The method according to claim 1, wherein the composition of the first perovskite layer and the composition of the second perovskite layer are different from each other.

5. The method according to claim 4, wherein the perovskite multilayered structure has a graded bandgap or a discrete bandgap.

6. A method of manufacturing a perovskite multilayered structure, comprising:
   providing a substrate;
   forming a first perovskite layer on the substrate;
   supplying halogen compounds in a vapor phase and at least one of metal halides, metal oxides, or metal sulfides in a vapor phase onto the first perovskite layer; and
   forming a second perovskite layer by a reaction between the halogen compounds and at least one of the metal halides, the metal oxides, or the metal sulfides.

7. The method according to claim 6, wherein the second perovskite layer is formed through a dual source vapor deposition process.

8. The method according to claim 6, wherein the composition of the first perovskite layer and the composition of the second perovskite layer are different from each other.

9. The method according to claim 8, wherein the perovskite multilayered structure has a graded bandgap or a discrete bandgap.

* * * * *